United States Patent
Lee et al.

(10) Patent No.: US 6,906,558 B2
(45) Date of Patent: Jun. 14, 2005

(54) DATA LATCH CIRCUIT AND METHOD FOR IMPROVING OPERATING SPEED IN A DATA LATCH CIRCUIT

(75) Inventors: Dong-Gyu Lee, Suwon (KR); Sung-Kwon Lee, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/726,636

(22) Filed: Dec. 4, 2003

(65) Prior Publication Data

US 2004/0113673 A1 Jun. 17, 2004

(30) Foreign Application Priority Data

Dec. 13, 2002 (KR) .................................. 10-2002-0079633

(51) Int. Cl.⁷ .............................. H03F 3/45; H03K 3/356
(52) U.S. Cl. ........................ 327/57; 327/208; 327/218
(58) Field of Search ................................ 327/51, 52, 56, 327/57, 199, 200, 208, 209, 210, 218, 141, 144

(56) References Cited

U.S. PATENT DOCUMENTS

| | | | | |
|---|---|---|---|---|
| 4,979,145 A | * | 12/1990 | Remington et al. | 711/106 |
| 5,262,990 A | * | 11/1993 | Mills et al. | 365/189.02 |
| 5,995,430 A | * | 11/1999 | Yabe | 365/203 |
| 6,078,837 A | * | 6/2000 | Peterson et al. | 607/14 |
| 6,329,857 B1 | * | 12/2001 | Fletcher | 327/215 |
| 6,574,163 B2 | * | 6/2003 | Maeda | 365/233 |
| 6,751,755 B1 | * | 6/2004 | Sywyk et al. | 714/54 |
| 6,756,823 B1 | * | 6/2004 | Chen et al. | 327/52 |

* cited by examiner

*Primary Examiner*—Tuan T. Lam
(74) *Attorney, Agent, or Firm*—Harness, Dickey & Pierce, P.L.C.

(57) ABSTRACT

A data latch circuit and method for improving operating speed therein may provide a reduction in delay time. The data latch circuit includes a sense amplifying unit outputting a first signal in response to input data, a first inverted signal in response to a clock signal, a second signal in response to given cascode data, and a second inverted signal in response to the clock signal. A clock latch unit may generate a gated clock signal to enable output of the given cascade data to the sense amplifying unit, in response to an enabling signal and the clock signal. A MUX unit outputs the first signal as output data and the first inverted signal as feedback data, or outputs the second signal as output data and second inverted signal as feedback data, based on the logic level of the enabling signal.

24 Claims, 3 Drawing Sheets

DATA LATCH CIRCUIT AND METHOD FOR IMPROVING OPERATING SPEED IN A DATA LATCH CIRCUIT

BACKGROUND OF THE INVENTION

This application claims the priority of Korean Patent Application No. 2002-79633 filed on Dec. 13, 2002, in the Korean Intellectual Property Office, the disclosure of which is incorporated herein in its entirety by reference.

1. Field of the Invention

The present invention relates to a data latch circuit and a method for improving operating speed in data latch circuits.

2. Description of the Related Art

Techniques of reducing the number of logic gate devices of a combinational logic block and techniques related to changing circuit style have been investigated in an effort to develop high-speed highly-integrated circuits such as microprocessor. A combinational logic block may refer to logic circuits that include logic gate devices such as AND gates and OR gates. Reducing the number of logic gate devices in a given logic circuit also reduced the number of devices through which input data must pass, potentially improving circuit operating speed. As an example of changing circuit style, static circuits may be replaced by dynamic circuits. In general, the operating speed of a dynamic circuit is higher than that of the static circuit.

In latch circuits, which store and output data, there are several techniques for reducing a delay time called "clock to q,". The clock to q delay time represents a time delay from the moment data is input to the latch circuit to the moment the data is output from the latch circuit. Until now, reducing the number of logic gate devices of a combinational logic block or changing a static circuit into a dynamic circuit have been considered effective ways of reducing the clock to q delay time.

FIG. 1 is a diagram of a conventional data latch circuit. The conventional data latch circuit 100 includes an inverter 120 which inverts a clock signal CLK, and a latch 110 which is activated in response to an inverted signal of the clock signal CLK. Latch 110 receives, and outputs, an enabling signal (ENS). A logical multiplier 130 calculates a logical multiplication of the output from latch 110 and the CLK to generate a gated clock signal (GCLK). A sense amplifier 140 receives, and transmits, input data, (referred to hereafter as 'INDATA') in response to the GCLK. A cascode logic unit 150 stores the output of the sense amplifier 140 and generates output data (referred to hereafter as 'OUTDATA'). The latch 110 and the logical multiplier 130 are used to generate the GCLK, which is produced from the logical multiplication of the CLK and the ENS. The data latch circuit 100 may perform the same function as a flip-flop circuit, for example.

FIG. 2 is a timing diagram illustrating operations of the conventional data latch circuit of FIG. 1. The ENS is input first at a high logic level (before the CLK is input) and then the CLK is input at a high logic level. With both CLK and ENS at a logic level high, the latch 110 is activated in response to an inverted signal of the CLK. Since both input signals of logical multiplier 130 are at a high logic level, the logical multiplier 130 outputs the GCLK at a high logic level.

In FIG. 2, reference element "A" represents a delay time of the GCLK based on the CLK. The GCLK has the delay time of "A" in FIG. 2 due to the operations required of the latch 110 and the logical multiplier 130. When the INDATA is input to the sense amplifier 140, the sense amplifier 140 outputs (as the OUTDATA) the INDATA stored in the cascode logic unit 150. This stored INDATA is output in response to the GCLK.

In FIG. 2, reference element "B" represents a delay time between a time from which the INDATA is input to the sense amplifier 140, to a time at which, the OUTDATA is output in response to the GCLK. The INDATA has the delay time of "B" in FIG. 2 due to the sense amplifier 140 and the cascode logic unit 150. Accordingly, to synchronize the INDATA with the CLK and output the INDATA as OUTDATA, a delay time of "A+B", (e.g., the clock to q delay time) is generated. This is undesirable in high-speed highly-integrated circuits such as microprocessors.

SUMMARY OF THE INVENTION

An exemplary embodiment of the present invention is directed to a data latch circuit that may provide a reduction in delay time between receipt of input data at the data latch circuit and transmission of output data to another circuit. The data latch circuit includes a sense amplifying unit outputting a first signal in response to input data, a first inverted signal in response to a clock signal, a second signal in response to given cascade data, and a second inverted signal in response to the clock signal. A clock latch unit may generate a gated clock signal to enable output of the given cascade data to the sense amplifying unit, in response to an enabling signal and the clock signal. A multiplexer unit outputs the first signal as output data and the first inverted signal as feedback data, or outputs the second signal as output data and second inverted signal as feedback data, based on the logic level of the enabling signal.

Another exemplary embodiment of the present invention is directed to a data latch circuit that includes a first data transmission unit and a second data transmission unit. The first transmission unit receives input data and generates output data in response to an enabling signal. The second data transmission unit receives given cascade data and generates feedback data in response to the enabling signal. The first data transmission unit also receives a given second signal from the second data transmission unit in response to a clock signal and the second transmission data unit receives a first inverted signal from the first data transmission unit in response to the clock signal. The data latch circuit may include a clock latch unit for generating a gated clock signal in response to the enabling signal and the clock signal, and a cascode logic unit to store the output data and the feedback data, and to generate the cascade data in response to the gated clock signal.

Another exemplary embodiment of the present invention is directed to a data transmission unit. The data transmission unit includes a sense amplifier that outputs a first signal in response to input data, and a multiplexer that receives the first signal via a first terminal and a second signal generated externally from the data transmission unit via a second terminal. The multiplexer outputs the first signal or the second signal as output data based on a logic level of an enabling signal applied thereto.

Another exemplary embodiment is directed to a method for improving operating speed in a circuit such as a data latch circuit. Another exemplary embodiment is directed to a method for improving operating speed in a circuit such as a data latch circuit. In the method, a first is generated in response to input data and a first inverted signal is generated in response to a clock signal. A second signal is generated in response to given cascade data and a second inverted signal in response to the clock signal. Based on a logic level of an enabling signal, the first signal or the second signal is output as output data, and one of the first inverted signal and second inverted signal is output as feedback data.

BRIEF DESCRIPTION OF THE DRAWINGS

Exemplary embodiments of the present invention will become more fully understood from the detailed description given herein below and the accompanying drawings, wherein like elements are represented by like reference numerals, which are given by way of illustration only and thus do not limit the exemplary embodiments of the present invention and wherein.

DETAILED DESCRIPTION OF THE EXEMPLARY EMBODIMENTS

Figure 3:
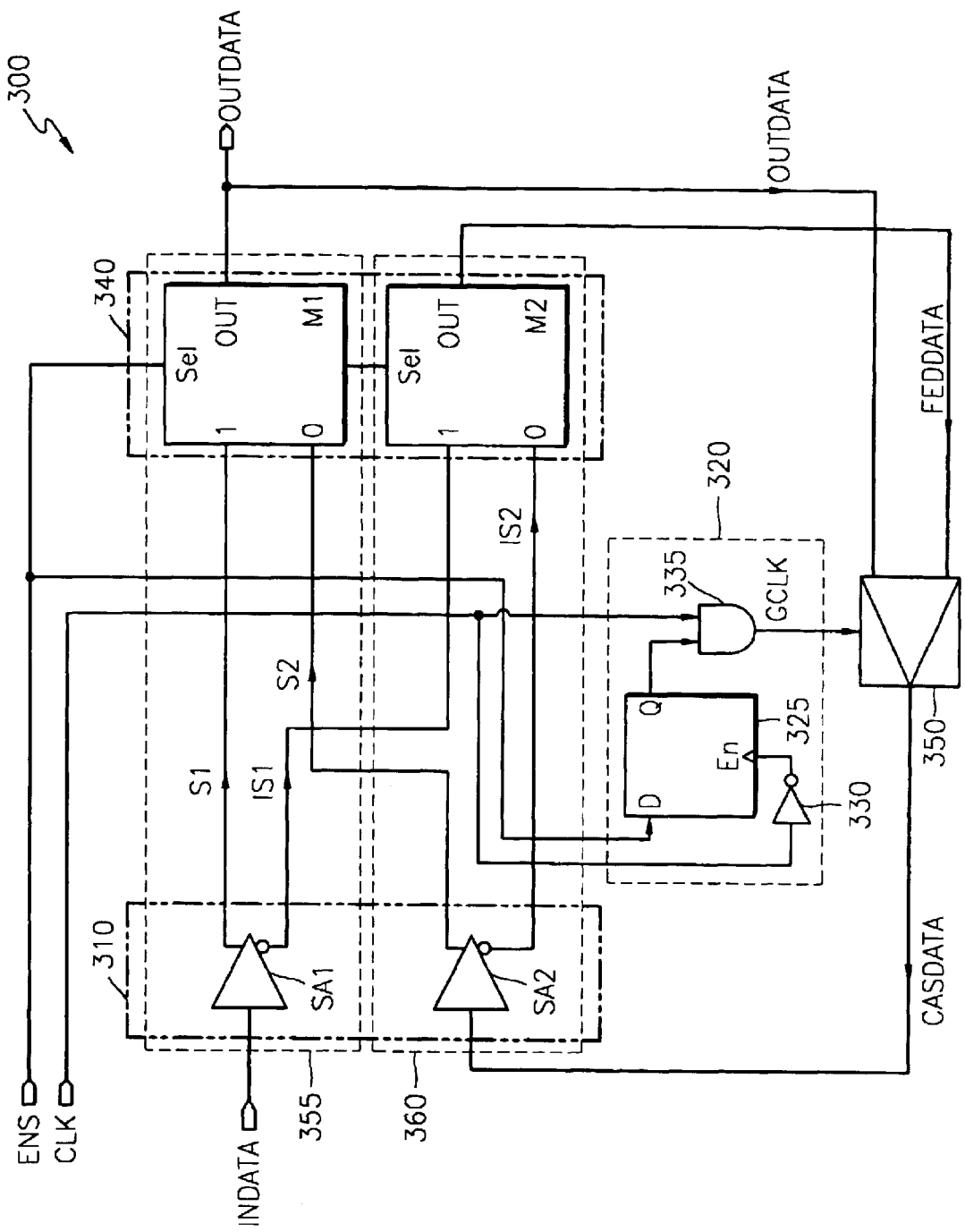
FIG. 3 is a circuit diagram of a data latch circuit according to an exemplary embodiment of the present invention.

FIG. 3 is a circuit diagram of a data latch circuit according to an exemplary embodiment of the present invention. Referring to FIG. 3, the data latch circuit 300 may include a sense amplifying unit 310 that receives input data INDATA to output first signal S1. The logic level of S1 is the same as that of the INDATA. In response to a clock signal CLK, sense amplifying unit 310 generates a first inverted signal IS1. The logic level of IS1 is opposite to the logic level of S1. Based on receiving given cascode data (CASDATA), sense amplifying unit 310 outputs a second signal S2. The logic level of S2 is the same as the logic level of the CASDATA. In response to the CLK, sense amplifying unit 310 also generates a second inverted signal IS2. The logic level of IS2 is opposite to the logic level of S2. Sense amplifying unit 310 may be configured as shown in FIG. 3, to include a first sense amplifier SA1 and a second sense amplifier SA2. First sense amplifier SA1 performs the functions described above with respect to S1 and IS1 above, and second sense amplifier SA2 performs the functions described with respect to S2 and IS2 above, thus the detail is omitted for reasons of clarity.

Data latch circuit 300 may include a clock latch unit 320. The clock latch unit 320 generates a gated clock signal GCLK. The GLCK is enabled (activated) when both an enabling signal ENS and the CLK are at a first logic level. The ENS may be activated before the CLK. Thus the activation of the GLCK depends on the logic level of the ENS and CLK. The clock latch unit 320 includes a latch 325 that receives the ENS. The latch 325 is activated in response to an inverted signal of the CLK. An inverter 330 generates the inverted CLK. Clock latch unit 320 includes a logical multiplier 335 for generating the GCLK. The logical multiplier 355 calculates a logic multiplication of the output of the latch 325 and the CLK to generate the GCLK.

Data latch circuit 300 may include a multiplexer (MUX) unit 340. The MUX unit 340 outputs S1 as output data OUTDATA and outputs IS1 as feedback data FEDDATA, if the ENS is at a first logic level. MUX unit 340 outputs S2 as the OUTDATA and IS2 as the FEDDATA, if the ENS is at a second level.

The MUX unit 340 may include a first selection unit M1 and a second selection unit M2, which may be embodied as multiplexers, for example. First selection unit M1 receives S1 via a first terminal and receives S2 via a second terminal. First selection unit M1 outputs S1 as the OUTDATA if the ENS is at a first logic level, and outputs S2 as the OUTDATA when the ENS is at a second logic level. The second selection unit M2 receives IS1 via a first terminal and IS2 via a second terminal. Second selection unit M2 outputs IS1 as the FEDDATA if the ENS is at a first logic level, and outputs IS2 as FEDDATA if ENS is at a second logic level.

Data latch circuit 300 may include a cascade logic unit 350. The cascode logic unit 350 receives and stores the OUTDATA and FEDDATA and generates the cascode data (CASDATA) in response to the GCLK.

Figure 4:
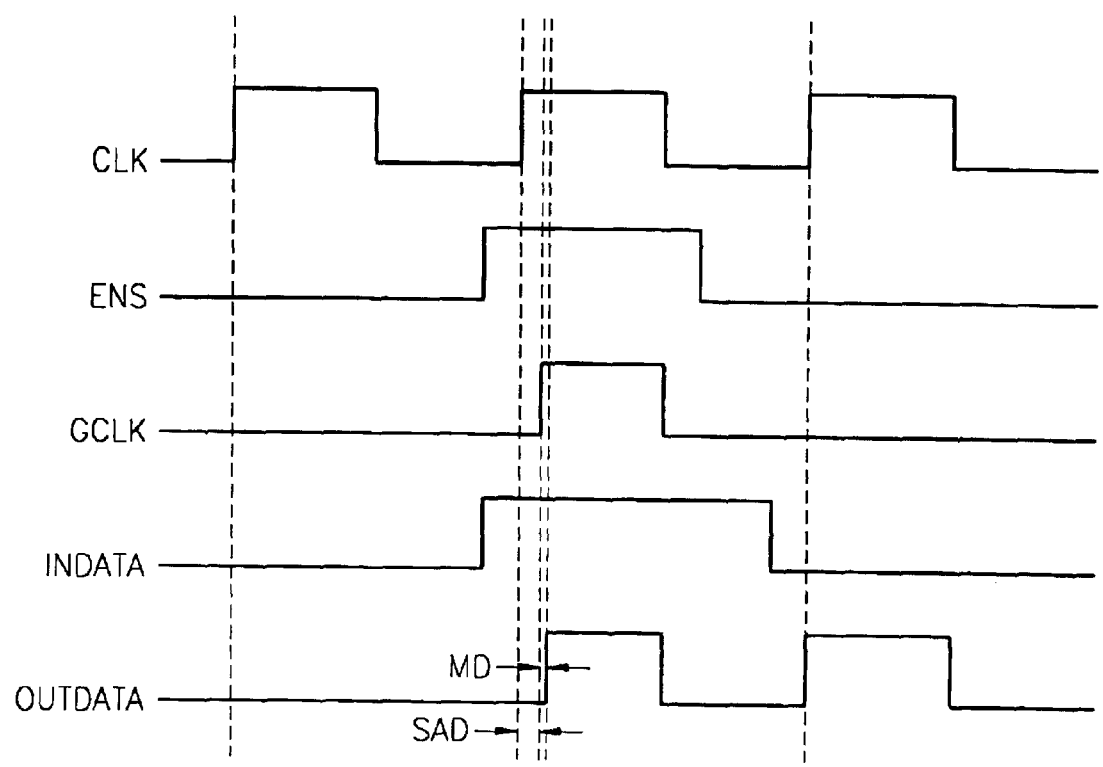
FIG. 4 is a timing diagram illustrating operations of the data latch circuit of FIG. 3 according to an exemplary embodiment of the present invention.

FIG. 4 is a timing diagram illustrating operations of the data latch circuit of FIG. 3. Hereinafter, the operations of the data latch circuit 300 of FIG. 3 will be described with reference to FIGS. 3 and 4.

Figure 1:
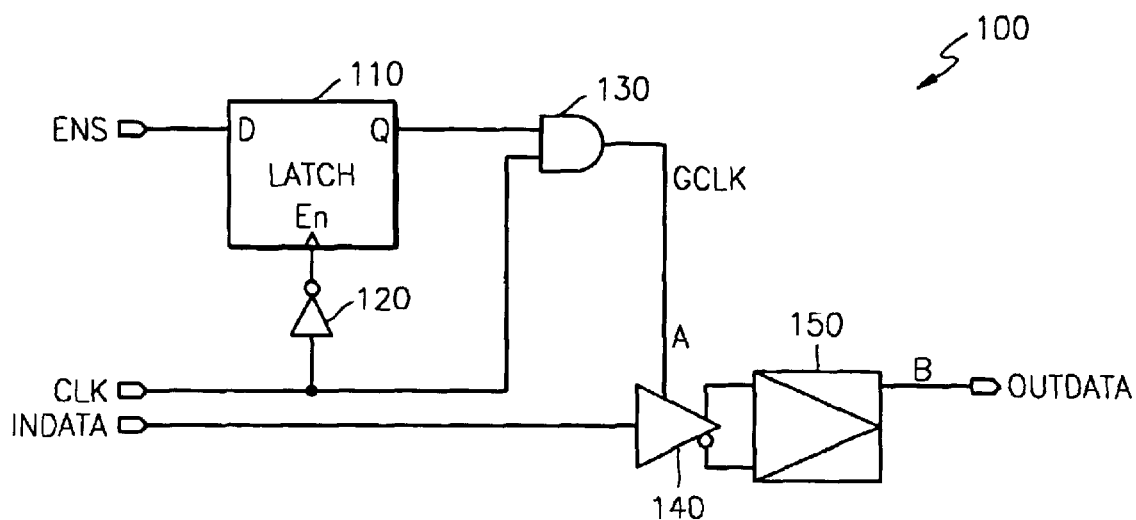
FIG. 1 is a circuit diagram of a conventional data latch circuit.
Figure 2:
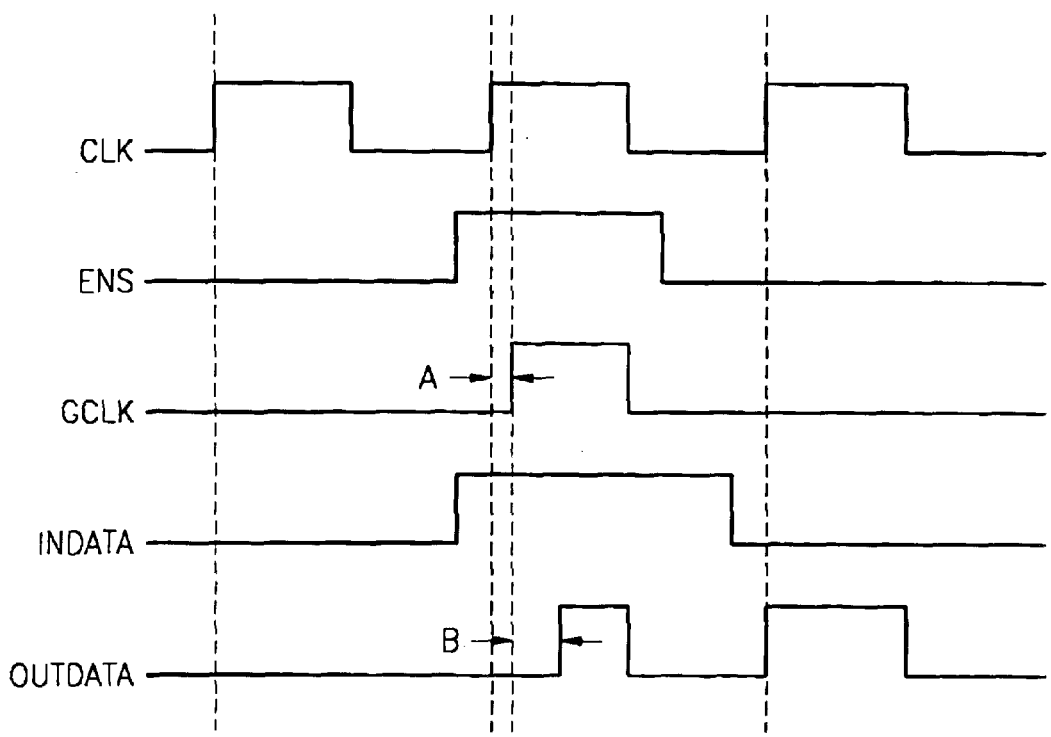
FIG. 2 is a timing diagram illustrating operations of the conventional data latch circuit of FIG. 1.

Unlike the sense amplifier 140 of the conventional data latch circuit 100 in FIG. 1, the first sense amplifier SA1 of the data latch circuit 300 of FIG. 3 may be operated in synchronization with the clock signal CLK rather than with the gated clock signal GCLK. Also, the output data OUTDATA may be output from first selection unit M1, which is activated in response to the enabling signal ENS to output the OUTDATA. As a result, the data latch circuit 300 may substantially reduce the delay time, or clock to q' as compared to the conventional data latch circuit 100. For example, the sum of (1) delay time between generation of the GCLK based on the CLK ('A' from FIG. 2), and (2) processing time required for the INDATA to pass through the cascode logic unit 150 and be generated as the OUTDATA ("B" from FIG. 2) may be substantially reduced as compared to the conventional data latch circuit 100.

Referring now to FIGS. 3 and 4, the first sense amplifier SA1, which may be considered a dynamic circuit (circuit that processes information in essentially real time) receives the INDATA and outputs S1 in response thereto, and outputs IS1, based on the CLK. As discussed above, the logic level of S1 matches that of the INDATA, and the logic level of IS1 is opposite the logic level of S1. The first sense amplifier SA1 thus receives and transmits the INDATA. Unlike the conventional case, the first sense amplifier SA1 is synchronized with the CLK and transmits the INDATA. The sense amplifier 140 of the conventional latch circuit 100 of FIG. 1 is not synchronized to the CLK, since the latch circuit 100 receives and transmits the input data INDATA based on the gated clock signal GCLK.

In FIGS. 3 and 4, since S1 has the same logic level as the INDATA, the INDATA is output as S1 through the first sense amplifier SA1. The first inverted signal IS1 has the opposite logic level INDATA (hence S1) and is transmitted to a second selection unit M2 to be described in further detail below.

The second sense amplifier SA2, which also may be considered a dynamic circuit, receives and transmits the cascade data CASDATA. Like the first sense amplifier SA1, the second sense amplifier SA2 is also synchronized with the CLK to transmit the CASDATA. Here, the cascode CASDATA may be obtained by outputting the OUTDATA stored in the cascode logic unit 350, for example.

Since the second signal S2 has the same logic level as that of the CASDATA, the CASDATA is output as S2 through the second sense amplifier SA2. As second inverted signal IS2 has the logic level opposite to that of the CASDATA (hence S2), IS2 is transmitted to a first selection unit M1 of MUX unit 340 to be described in further detail below.

As previously discussed, the MUX unit 340 outputs S1 as the OUTDATA and IS1 as the FEDDATA when the ENS is at a first level, and outputs S2 as the OUTDATA and IS2 as the FEDDATA when the ENS is at a second logic level. A more detailed explanation follows for the function of first selection unit M1 and second selection unit M2 of MUX unit 340.

Function of First Selection Unit M1

First selection unit M1 of MUX unit 340, which may be embodied as a multiplexer, for example, receives S1 via a first terminal, and receives S2 via a second terminal. First selection unit M1 thus outputs S1 (OUTDATA) and IS1 (FEDDATA), or S2 and IS2 Based on the logic level of the ENS.

The first logic level may be understood as a logic HIGH and the second level may be understood as a logic LOW; however, it is apparent to those skilled in the art that the reverse may be possible. Accordingly, when ENS is at a logic HIGH, the first selection unit M1 outputs S1, (i.e., representing the INDATA) as OUTDATA to cascode logic unit 350, as shown in FIG. 3.

Conversely, when the ENS is at a logic LOW, first selection unit M1 outputs S2 (i.e. representing the CASDATA), as OUTDATA. The second signal S2 is thus equivalent to the cascode output data CASDATA, which when output of first selection unit M1 as OUTDATA, is in synchronization with the prior clock signal CLK.

Accordingly, when the enabling signal ENS is at a logic LOW (low level ) and IS2 is output as the OUTDATA, the prior output data OUTDATA is output as the OUTDATA. In other words, the second sense amplifier SA2 is used to maintain the prior output data (prior OUTDATA).

Function of Second Selection Unit M2

In general, the second selection M2, which may be embodied as a multiplexer, for example, receives IS1 via the first terminal and S2 via the second terminal, and outputs IS1 as the FEDDATA when the enabling signal ENS is at a first logic level. The second selection M2 outputs the second inverted signal IS2 as FEDDATA when the enabling signal ENS is at a second logic level.

When ENS is at a logic HIGH (high level), IS1 (the logic level of which is opposite to that of the INDATA) is output as FEDDATA. When the ENS is at a logic LOW (low level), the second inverted signal IS2 (the logic level of which is opposite to that of the CASDATA) is output as FEDDATA. Therefore, the FEDDATA has a logic level which is complementary to the logic level of the OUTDATA.

Generation of the Gated Clock Signal (GCLK)

Referring to FIGS. 3 and 4, the clock latch unit 320 generates the gated clock signal GCLK in response to the enabling signal ENS and the clock signal CLK. The ENS may be activated before the CLK. The GLCK is generated when both the ENS and the CLK are at a first logic level. As previously discussed, the latch 325 receives the ENS and is activated in response to an inverted CLK from inverter 330. The logical multiplier 335 calculates the logic multiplication of the output of the latch 325 and the CLK to thus generate the GCLK.

In the conventional data latch circuit 100, the sense amplifier 140 transmits the INDATA in response to the gated clock signal GCLK. On the other hand, in accordance with the exemplary embodiments of the present invention, the GCLK is not used to transmit the INDATA, but used merely to enable (activate) the cascode logic unit 350 to output the OUTDATA stored therein, to be output as the CASDATA.

For this reason, a delay time between a time when the INDATA is input to the data latch circuit 300, to a time when the INDATA is output as OUTDATA, may be eliminated.

As illustrated in FIG. 4, for example, a delay time (clock to q), which represents a time at which the INDATA is input to the first sense amplifier SA1 to a time the INDATA is output as the OUTDATA (from first selection unit M1), is a sum of a delay time 'SAD' caused by the first sense amplifier SA1 and a delay time 'MD' caused by the first selection unit M1 of the MUX unit 340.

Accordingly, and in view of the sum of the clock to q delay time (A+B) generated by the conventional data latch circuit 100, the clock to q delay time can therefore be substantially reduced. In other words, the delay time A (time due to generation of GCLK from CLK) and the delay time B (processing time consumed as the INDATA passes through cascode logic unit 150) can be reduced, thereby reducing the clock to q. Thus, time consumed for the INDATA to be transmitted via the data latch circuit 300 to another dynamic circuit, for example, may be substantially reduced, potentially offering improvements in operating speed of the data latch circuit 300 in particular, and improvements in operating speed in high-speed integrated circuits employing the data latch circuit, for example.

A data latch circuit according to another preferred embodiment of the present invention will be described with reference to FIG. 3. Although the above exemplary embodiment has been described in terms of separate components, a data latch circuit 300 may be configured so that the sense amplifiers SA1 and SA2 may be combined with corresponding selection circuits M1 and M2 into integral data transmission circuits 355 and 360. For example, a first data transmission unit 355 may include the first sense amplifier SA1 and first selection unit M1, and the second data transmission unit 360 may include the second sense amplifier SA2 and second selection unit M2.

The functions of each of the first sense amplifier SA1, first selection unit M1, second sense amplifier SA2, second selection unit M2, clock latch unit 320 and cascode logic unit 350 have been described in explicit detail above, and functions and operations of these components are the same as those of the previous exemplary embodiment of the present invention.

In operation, first data transmission unit 355 receives input data INDATA and a given second signal S2 in response to a clock signal CLK, and generates output data OUTDATA in response to an enabling signal ENS. The second data transmission unit 360 receives given cascode data CASDATA and the first inverted signal IS1 in response to the clock signal CLK, and generates feedback data FEDDATA in response to the enabling signal ENS.

In second data transmission unit 360, for example, second sense amplifier SA2 receives the CASDATA, outputs S2 in response to the CASDATA (the logic level of which is the same as that of the CASDATA), and outputs IS2 (he logic level of which is opposite to that of S2) in response to the clock signal CLK.

The second selection unit M2 receives IS1 via the first terminal and IS2 via the second terminal, and outputs IS1 as the FEDDATA when the ENS is at a first logic level. Second selection unit M2 outputs the IS2 as the FEDDATA when the ENS is at a second logic level.

In first data transmission unit 355, first sense amplifier SA1 and the first selection unit M1 perform the same functions as those described in detail in the previous exemplary embodiment of the present invention. Therefore, the detailed descriptions of these elements will be omitted here for brevity.

As set forth above, the data latch circuit according to the exemplary embodiments of the present invention enables a reduction in the time taken when a gated clock signal is generated, and a reduction in the time consumed for the input data to pass through a cascode logic unit. As a result, the time required for input of input data to the data latch circuit, to time of output from the data latch circuit, may be reduced, potentially offering improvements in operating speed of the data latch circuit in particular, and in high-speed integrated circuits employing the data latch circuit, for example.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A data latch circuit, comprising:
   a sense amplifying unit outputting a first signal in response to input data, a first inverted signal in response to a clock signal, a second signal in response to given cascode data, and a second inverted signal in response to the clock signal;
   a clock latch unit generating a gated clock signal for enabling output of the cascode data to the sense amplifying unit, in response to an enabling signal and the clock signal; and
   a multiplexer unit outputting the first signal as output data and the first inverted signal as feedback data, or outputs the second signal as output data and second inverted signal as feedback data, based on a logic level of the enabling signal.

2. The circuit of claim 1, wherein
   the first signal is output as output data the first inverted signal is output as feedback data, when the enabling signal is at a first logic level, and
   the second signal is output as output data and the second inverted signal is output as feedback data, when the enabling signal is at a second logic level.

3. The circuit of claim 1, further comprising a cascode logic unit storing the output data and feedback data and generating the cascode data in response to the gated clock signal.

4. The circuit of claim 1, wherein
   the logic level of the first signal is the same as the logic level of the input data,
   the logic level of the first inverted signal is opposite to the logic level of the first signal,
   the logic level of the second signal is the same as the logic level of the cascade data, and
   the logic level of the second inverted signal is opposite to the logic level of the second signal.

5. The circuit of claim 1, wherein the gated clock signal is enabled when both the enabling signal and the clock signal are synchronized at the same logic level.

6. The circuit of claim 3, wherein the sense amplifying unit includes:
   a first sense amplifier outputting the first signal in response to the input data, and the first inverted signal in response to the clock signal; and
   a second sense amplifier outputting the second signal in response to the cascode data and outputting the second inverted signal in response to the clock signal.

7. The circuit of claim 1, wherein the multiplexer unit includes:
   a first selection unit receiving the first signal via a first terminal and the second signal via a second terminal, outputting the first signal as output data when the enabling signal is at the first logic level and outputting the second signal as output data when the enabling signal is at the second logic level; and
   a second selection unit receiving the first inverted signal via a first terminal and the second inverted signal via a second terminal, outputting the first inverted signal as feedback data when the enabling signal is at the first logic level and outputting the second inverted signal as feedback data when the enabling signal is at the second logic level.

8. The circuit of claim 7, wherein a first selection unit and a second selection unit are multiplexers.

9. The circuit of claim 1, wherein the clock latch unit includes:
   an inverter generating an inverted signal of the clock signal;
   a latch receiving the enabling signal and activated in response to the inverted clock signal; and
   a logical multiplier calculating a logic multiplication of an output of the latch and the clock signal for generating the gated clock signal.

10. A data latch circuit, comprising:
    a first data transmission unit receiving input data and generating output data in response to an enabling signal;
    a second data transmission unit receiving given cascade data and generating feedback data in response to the enabling signal;
    the first data transmission unit further receiving a given second signal from the second data transmission unit in response to a clock signal,
    the second transmission data unit further receiving a first inverted signal from the first data transmission unit in response to the clock signal,
    a clock latch unit generating a gated clock signal in response to the enabling signal and the clock signal; and
    a cascode logic unit storing the output data and the feedback data and generating the cascode data in response to the gated clock signal.

11. The circuit of claim 10, wherein the gated clock signal is enabled when the enabling signal and the clock signal are synchronized at the same logic level.

12. The circuit of claim 10, wherein the first data transmission unit includes:
    a first sense amplifier outputting a first signal in response to the input data and the first inverted signal in response to the clock signal, wherein the logic level of the first signal is the same as the logic level of the input data, and wherein the logic level of the first inverted signal is opposite to the logic level of the first signal; and
    a first selection unit receiving the first signal via a first terminal and the second signal via a second terminal, outputting the first signal as the output data when the enabling signal is at a first level, and outputting the second signal as the output data when the enabling signal is at a second level.

13. The circuit of claim 12, wherein the first selection unit is a multiplexer.

14. The circuit of claim 10, wherein the second data transmission unit includes:

a second sense amplifier receiving the cascode data from the cascade logic unit and outputting the second signal, wherein the logic level of the second signal is the same as the logic level of the cascode data, and outputting the second inverted signal in response to the clock signal, wherein the logic level of the second inverted signal is opposite to the logic level of the second signal; and a second selection unit receiving the first inverted signal via a first terminal and the second inverted signal via a second terminal, outputting the first inverted signal as the feedback data when the enabling signal is at a first level, and outputting the second inverted signal as the feedback data when the enabling signal is at a second level.

15. The circuit of claim 14, wherein the second selection unit is a multiplexer.

16. The circuit of claim 10, wherein the clock latch unit includes:

an inverter generating an inverted signal of the clock signal;

a latch receiving the enabling signal and activated in response to the inverted clock signal; and a logical multiplier calculating a logic multiplication of an output of the latch and the clock signal for generating the gated clock signal.

17. A method of improving operating speed in a circuit, comprising:

generating a first signal in response to input data and a first inverted signal in response to a clock signal;

generating a second signal in response to given cascode data and a second inverted signal in response to the clock signal;

outputting one of the first signal and second signal as output data and one of the first inverted signal and second inverted signal as feedback data based on a logic level of an enabling signal.

18. The method of claim 17, wherein the outputting step includes outputting the first signal as output data and the first inverted signal as feedback data, when the enabling signal is at a first logic level, and outputting the second signal as output data and the second inverted signal as feedback data, when the enabling signal is at a second logic level.

19. The method of claim 17, further comprising:

storing the output data and feedback data.

20. The method of claim 17, further comprising:

generating a gated clock signal in response to an enabling signal and the clock signal; and generating the cascode data in response to the gated clock signal, the cascade data including the output data and feedback data.

21. The method of claim 20, further comprising activating the gated clock signal when both the enabling signal and the clock signal are synchronized at the same logic level.

22. The method of claim 17, wherein the logic level of the first signal is the same as the logic level of the input data, the logic level of the first inverted signal is opposite to the logic level of the first signal, the logic level of the second signal is the same as the logic level of the cascade data, and the logic level of the second inverted signal is opposite to the logic level of the second signal.

23. A data latch circuit configured with improved operating speed in accordance with the method of claim 17.

24. A data transmission unit for a data latch circuit configured with improved operating speed in accordance with the method of claim 17.

* * * * *